United States Patent
Li et al.

(10) Patent No.: US 10,199,801 B2
(45) Date of Patent: Feb. 5, 2019

(54) HIGH-POWER SEMICONDUCTOR LASER BASED ON VCSEL AND OPTICAL CONVERGENCE METHOD THEREFOR

(71) Applicant: SANHE LASERCONN TECH CO., LTD., Sanhe (CN)

(72) Inventors: Yang Li, Beijing (CN); Delong Li, Beijing (CN)

(73) Assignee: SANHE LASERCONN TECH CO., LTD., Sanhe (CN)

( * ) Notice: Subject to any disclaimer, the term of this patent is extended or adjusted under 35 U.S.C. 154(b) by 0 days.

(21) Appl. No.: 15/525,592

(22) PCT Filed: Dec. 7, 2014

(86) PCT No.: PCT/CN2014/093208
§ 371 (c)(1),
(2) Date: May 10, 2017

(87) PCT Pub. No.: WO2016/074299
PCT Pub. Date: May 19, 2016

(65) Prior Publication Data
US 2017/0331254 A1    Nov. 16, 2017

(30) Foreign Application Priority Data

Nov. 10, 2014  (CN) .................... 2014 2 0680059 U (51) Int. Cl.
*H01S 5/18* (2006.01)
*H01S 5/183* (2006.01)
(Continued)

(52) U.S. Cl.
CPC .......... *H01S 5/18361* (2013.01); *H01S 5/005* (2013.01); *H01S 5/4043* (2013.01);
(Continued)

(58) Field of Classification Search
CPC .... H01S 5/18361; H01S 5/4043; H01S 5/426; H01S 5/423; H01S 5/005; H01S 5/02252; H01S 5/02469; H01S 5/4012
See application file for complete search history.

(56) References Cited

U.S. PATENT DOCUMENTS

2002/0015442 A1   10/2002   Willden
2013/0255613 A1*  10/2013   Hartke .................... F02P 23/04
                                                    123/143 B

FOREIGN PATENT DOCUMENTS

CN       2928026       8/2007
CN     101447647       6/2009
(Continued)

*Primary Examiner* — Armando Rodriguez
(74) *Attorney, Agent, or Firm* — Mark M. Friedman (57) ABSTRACT

Provided is a high-power semiconductor laser based on VCSEL, comprising a VCSEL laser module. The VCSEL laser module includes a VCSEL chip array (1) consisting of a plurality of VCSEL chips (10) and an inner wall reflection optical transmission device (2) which is arranged in front of a light emergent face of the VCSEL chip array (1); and the light emergent face of the VCSEL chip array (1) is used for secondarily reflecting the reflected light reflected by a target object (3) and the inner wall reflection optical transmission device (2). Also provided is a packaging structure for the high-power semiconductor laser. The VCSEL chip array (1) is packaged by an inwardly concave arc-shaped heat sink (4), so that the purpose of converging the laser light beam near a centre position can be achieved.

17 Claims, 6 Drawing Sheets

(51) Int. Cl.
*H01S 5/40* (2006.01)
*H01S 5/42* (2006.01)
*H01S 5/00* (2006.01)
H01S 5/022 (2006.01)
H01S 5/024 (2006.01)

(52) U.S. Cl.
CPC .............. *H01S 5/423* (2013.01); *H01S 5/426* (2013.01); *H01S 5/0228* (2013.01); *H01S 5/02252* (2013.01); *H01S 5/02469* (2013.01); *H01S 5/4012* (2013.01)

(56) References Cited

FOREIGN PATENT DOCUMENTS

| | | |
|---|---|---|
| CN | 201556835 | 8/2010 |
| CN | 202602081 | 12/2012 |
| CN | 203060609 | 7/2013 |
| CN | 103412406 | 11/2013 |
| CN | 204290033 | 4/2015 |
| CN | 204290035 | 4/2015 |
| WO | 2013032954 | 3/2013 |

\* cited by examiner

HIGH-POWER SEMICONDUCTOR LASER BASED ON VCSEL AND OPTICAL CONVERGENCE METHOD THEREFOR

BACKGROUND

Technical Field

The present invention relates to a high-power semiconductor laser that uses a vertical cavity surface emitting laser (VCSEL) as a light source, and also to an optical convergence method for the high-power semiconductor laser, and belongs to the field of semiconductor laser technologies.

Related Art

Over the past twenty years, in the field of high-power semiconductor lasers, GaAs material-based edge-emitting semiconductor lasers have always been dominant, and have been widely applied to fields such as industry, medical treatment, and scientific research. However, the edge-emitting semiconductor lasers have fatal defects. Although an expected life of service of an edge-emitting semiconductor laser is up to tens of thousands of hours, the catastrophic optical damage probability of the edge-emitting semiconductor laser in a pulse status is extremely great, which seriously affects the life of service. Therefore, an actual life of service of the edge-emitting semiconductor laser is far from reaching the ideal expected life of service. Therefore, a new semiconductor laser applicable to the industrial field needs to be provided.

Figure 1:
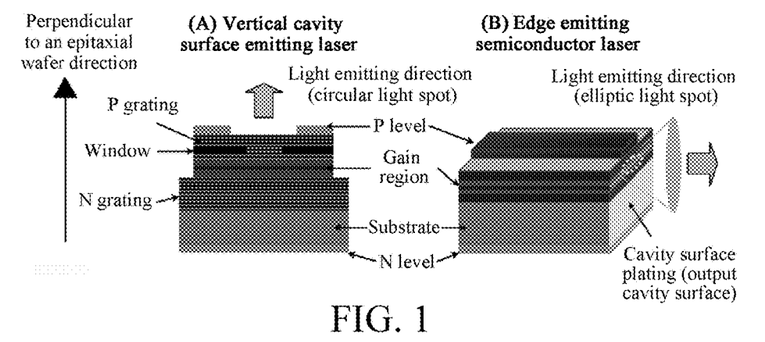
FIG. 1 is a schematic structural diagram of a VCSEL and an edge-emitting laser.

In the field of semiconductor lasers, lasers may be grouped into two types: VCSELs and edge-emitting semiconductor lasers according to a relationship between a light emitting direction and an epitaxial wafer plane where a laser chip is located. A light emitting direction of a VCSEL is perpendicular to an epitaxial wafer direction, and light is emitted from a top surface of a reaction region. A light emitting direction of an edge-emitting semiconductor laser is parallel to an epitaxial wafer direction, and light is emitted from an edge of a reaction region. Refer to the schematic diagram shown in FIG. 1 for structures of the VCSEL and the edge-emitting semiconductor laser.

Figure 2:
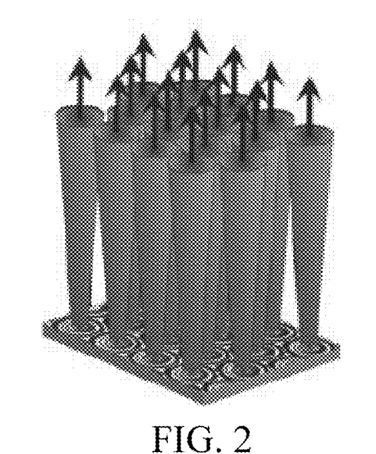
FIG. 2 is a schematic diagram of a light emitting direction of a VCSEL array.

The edge-emitting semiconductor laser and the VCSEL respectively have the following features: the edge-emitting semiconductor laser is a linear light source, a divergence angle of the edge-emitting semiconductor laser in the vertical direction is extremely different from a divergence angle of the edge-emitting semiconductor laser in the horizontal direction (a full angle in the vertical direction is approximately 60 degrees to 70 degrees, and a full angle in the horizontal direction is approximately 7 degrees to 10 degrees), and far field intensity of the edge-emitting semiconductor laser is in Gaussian distribution; however, as shown in FIG. 2, the VCSEL is a circular light source, and has a relatively small divergence angle (a full angle of the divergence angle is approximately 15 degrees to 20 degrees), far field intensity of the VCSEL is in approximately flat top distribution, and energy is uniform. Therefore, as compared with the edge-emitting semiconductor laser, light rays emitted by the VCSEL are more easily converged, and energy distribution on a far field target object is uniform. In addition, as compared with the edge-emitting semiconductor laser, the VCSEL further has other advantages. For example, the VCSEL has a relatively high working temperature, a relatively long expected life of service, and a low fault rate, may further be packaged by using a process similar to an LED process, and has a low package process requirement. However, conventional VCSELs have always been ignored in the high-power market due to relatively low electro-optic efficiency and relatively poor optical brightness.

With the progress of technologies in recent years, a high-power output of the VCSEL similar to that of the edge-emitting semiconductor laser has been gradually implemented. Also, due to a unique structure of the VCSEL, there are multiple advantages in application of the VCSEL, for example, high reliability, high temperature resistance, uniform optical distribution, and high surface reflectivity. A brand new revolution will be brought to the field of semiconductor lasers if the VCSEL is improved to be gradually applied to some industrial application fields.

Refer to Table 1 for specific performance comparison between the VCSEL and the edge-emitting semiconductor laser.

TABLE 1

Structural performance comparison between edge-emitting semiconductor laser and VCSEL

| Index | Edge-emitting laser (single point or array) | VCSEL (single point or array) |
| --- | --- | --- |
| Light emitting direction | Direction of a plane where an epitaxial wafer is located | Perpendicular to a plane where an epitaxial wafer is located |
| Light emitting region | Linear light source, or formed horizontal + vertical array | Circular light source, or formed area array |
| Divergence angle | Full angle in a vertical direction is approximately 60 degrees to 70 degrees | Full angle of a divergence angle is approximately 15 degrees to 20 degrees |
|  | Full angle in a horizontal direction is approximately 7 degrees to 10 degrees | In a circular symmetry structure |
| Surface reflectivity | Depending on an array package manner, generally low | Extremely high reflectivity, >99.5% |
| Far field intensity at luminous points | Gaussian distribution | Approximately flat top distribution, and uniform energy |
| Spectral width | Generally, >2.5 nm | Generally, <1 nm |
| Wavelength-temperature drift | 0.3 nm/C. | <0.07 nm/C. |

TABLE 1-continued

Structural performance comparison between edge-emitting semiconductor laser and VCSEL

| Index | Edge-emitting laser (single point or array) | VCSEL (single point or array) |
| --- | --- | --- |
| Working temperature | <35 C. (industrial grade), <45 C. (communication grade) | >80 C. even >100 C. |
| Electro-optic efficiency | 50% to 60%, efficiency seriously decreases under high temperature | 45% to 60%, slightly low, but relatively high efficiency can still be maintained under high temperature |
| Catastrophic optical damage | Exist, has extremely great affect on life of service | Not exist |
| Expected life of service | ~10000 hours (industrial grade), ~50000 hours (communication grade) | More than hundreds of thousands of hours |
| Fault rate (*FIT rate) | Industrial grade FIT >1000, communication grade FIT-500 | FIT <2, has extremely high reliability |
| Package process | High package technical requirement | Low package technical requirement, similar to an LED process |

Note:
*FIT rate is the number of faults that occur in every 1 billion device working hours

SUMMARY

A first technical problem to be resolved by the present invention lies in providing a High-power semiconductor laser based on VCSEL, applicable to laser medical and industrial laser processing fields.

Another technical problem to be resolved by the present invention lies in providing an optical convergence method for a VCSEL.

To achieve the foregoing objectives of the invention, the present invention uses the following technical solutions:

In one aspect of the present invention, a High-power semiconductor laser based on VCSEL is provided, including a VCSEL module, where the VCSEL module includes a VCSEL chip array formed by multiple VCSEL chips and an inner wall reflective optical transmission device disposed in front of a light emitting surface of the VCSEL chip array, and the light emitting surface of the VCSEL chip array performs secondary reflection on reflected light rays reflected by a target object and the inner wall reflective optical transmission device.

Preferably, in the VCSEL chip array, the multiple VCSEL chips may be densely arranged in one plane, and light emitting surfaces thereof form a planar light emitting surface; alternatively, the multiple VCSEL chips may also be arranged at an angle with each other, and light emitting surfaces of the multiple VCSEL chips form a circumscribed polygonal light emitting surface that is approximately arc-shaped and uses the target object as a circle center.

In another aspect of the present invention, a High-power semiconductor laser based on VCSEL is provided, including a VCSEL package structure, where the VCSEL package structure includes a VCSEL array formed by multiple VCSEL chips and an arc-shaped heat sink for packaging the VCSEL array, a cross section of a package surface of the arc-shaped heat sink is a partial circumscribed polygon of a circle, the package surface is formed by multiple small package planes at an angle with each other, the package surface is recessed inwards, and central normals of the small package planes intersect at a position of a circle center; and all VCSEL chips in the VCSEL array are respectively installed on the small package planes of the heat sink, so that all the VCSEL chips are distributed on an outer circumference of a same circle, and central normals of all the VCSEL chips intersect at a position of a circle center to form a focus, and a distance between the VCSEL chips and the focus forms a focal length.

In addition, the present invention further provides an optical convergence method for a VCSEL, including the following steps: enabling all VCSEL chips in an VCSEL array or orthographic projections thereof to be distributed on an outer circumference of a same circle, and enabling central normals of all the VCSEL chips to intersect at a position of a circle center to form a focus; and a distance between the VCSEL chips and the focus forms a focal length.

Preferably, the VCSEL array may be packaged by using a heat sink having a package surface that is recessed inwards, the package surface of the heat sink is formed by multiple small package planes at an angle with each other, a cross section of the package surface is a partial circumscribed polygon of a circle that uses the focus as a circle center, and central normals of the small package planes intersect at a position of a circle center.

According to the VCSEL module provided in the present invention, light rays emitted by the VCSEL chip array are effectively transmitted by using the inner wall reflective optical transmission device to be focused on a target object; and light rays reflected from the target object are reflected to a light emitting surface of the VCSEL chip array by using the inner wall reflective optical transmission device; the light emitting surface of the VCSEL chip array performs secondary reflection on reflected light rays reflected by the target object and the inner wall reflective optical transmission device. A surface of the VCSEL chip array has extremely high reflectivity, in particular, in areas occupied by the VCSEL chips, the reflectivity reaches 99.5% or even above. Therefore, the surface of the VCSEL chip array may perform highly efficient secondary utilization on the reflected light rays reflected by the target object, so as to sufficiently improve a utilization rate of laser.

The VCSEL module may greatly improve laser emitting efficiency and target object absorptivity. In addition, the tapered inner wall reflective optical transmission device is used to effectively converge emitting light rays, so as to further improve optical power density of an emission opening. In view of that the VCSEL has a relatively long life of service, and displays high reliability in a pulse status, applying the foregoing VCSEL laser module to a high-power semiconductor laser has extremely great practical significance. The high-power semiconductor laser including the foregoing VCSEL module provided in the present invention has broad application prospects in fields such as laser medical treatment and industrial laser processing.

In addition, the package structure of the high-power semiconductor laser provided in the present invention implements laser convergence of the VCSEL by changing an arrangement shape of the VCSEL chip array. Specifically, in the package structure thereof, the VCSEL array is packaged by using an arc-shaped heat sink that is recessed inwards, so as to achieve the objective of converging light beams of laser near a position of a circle center. In addition, an optical device with transmissivity is disposed in front of the VCSEL array to implement further compression of light beams. The package structure of a VCSEL array changes an arrangement shape of the VCSEL chip array in a simple manner, to implement light beam convergence of multiple VCSEL chips at a particular position, and has broad application prospects in laser medical and industrial laser processing fields.

DETAILED DESCRIPTION

The technical content of the present invention is described in detail below with reference to the accompanying drawings and specific embodiments.

Figure 4:
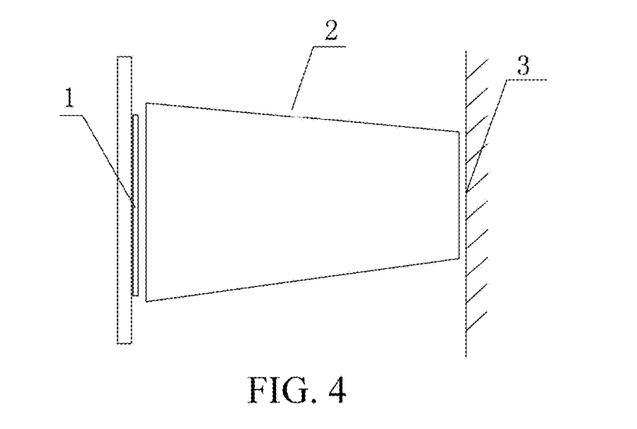
FIG. 4 is a schematic structural diagram of a first VCSEL module according to an embodiment of the present invention.
Figure 7:
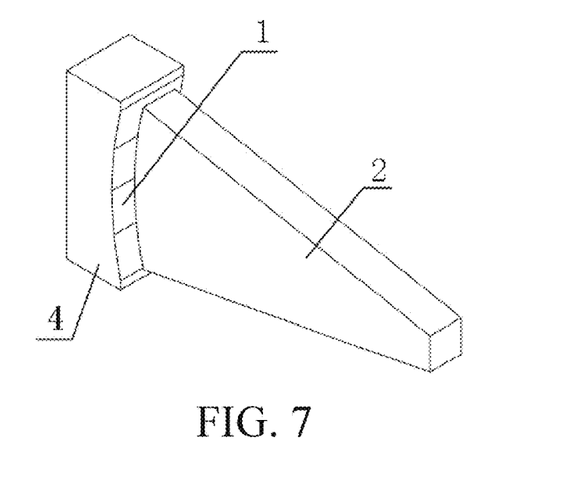
FIG. 7 is a schematic structural diagram of a second VCSEL module according to an embodiment of the present invention.

A high-power semiconductor laser provided in the present invention includes a VCSEL module according to either FIG. 4 or FIG. 7. The VCSEL module includes a VCSEL chip array 1 formed by multiple VCSEL chips and an inner wall reflective optical transmission device 2 disposed in front of a light emitting surface of the VCSEL chip array 1. The VCSEL chip array 1 and the inner wall reflective optical transmission device 2 are placed in front of a target object 3, and then a VCSEL is started, so as to implement a laser ablation function on the target object 3 by the VCSEL module. The inner wall reflective optical transmission device 2 may effectively transmit light rays emitted by the VCSEL chip array 1, to enable the light rays emitted by the VCSEL chip array 1 to focus on the target object 3. In addition, the inner wall reflective optical transmission device 2 may reflect light rays reflected from the target object 3 to the light emitting surface of the VCSEL chip array 1, and the light emitting surface of the VCSEL chip array 1 performs highly efficient secondary reflection on light rays reflected by the target object 3 and the inner wall reflective optical transmission device 2.

Figure 5:
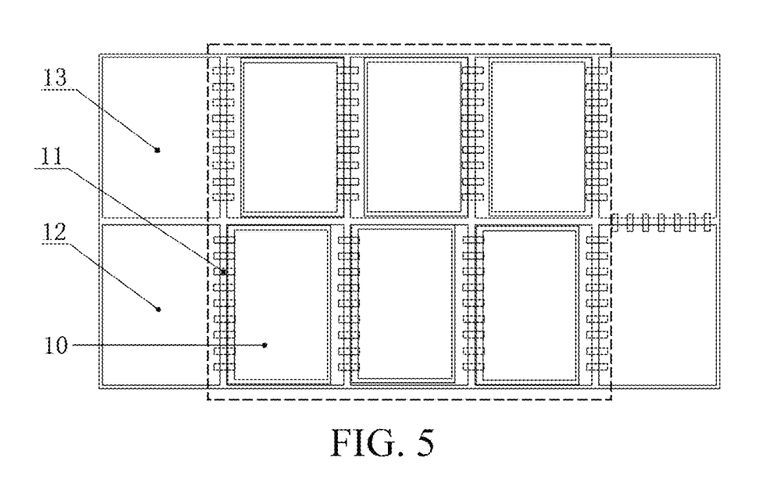
FIG. 5 is a schematic diagram of a first arrangement manner of multiple VCSEL chips in a VCSEL chip array.
Figure 6:
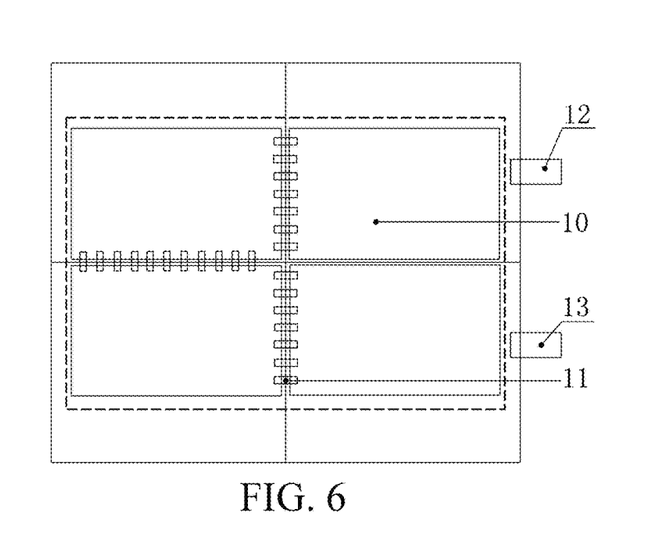
FIG. 6 is a schematic diagram of a second arrangement manner of multiple VCSEL chips in a VCSEL chip array.

Specifically, as shown in FIG. 5 and FIG. 6, in the VCSEL chip array 1 of a first VCSEL module, a single VCSEL chip 10 is directly welded on a heat dissipation substrate to form a light emitting plane; multiple VCSEL chips 10 are densely arranged to form a large planar light emitting surface; the multiple VCSEL chips 10 are welded to each other by using metal wires 11, and a cathode 12 and an anode 13 are connected to an outer side of the entire light emitting surface. Intrinsic properties of the VCSEL determine that the light emitting surface has extremely high reflectivity on laser, and in particular, in areas occupied by the VCSEL chips 10, the reflectivity reaches 99.5% or even above. Gap portions with relatively low reflectivity may be reduced to a greatest extent by means of more compact arrangement of the VCSEL chips 10. Therefore, the light emitting surfaces of the VCSEL chips 10 have a relatively high secondary utilization rate for light rays reflected to a surface of the light emitting surface.

With reference to FIG. 4 to FIG. 7, it can be known that in the VCSEL chip array 1, multiple VCSEL chips 10 may be densely arranged in one plane, so that light emitting surfaces thereof are densely arranged into a planar light emitting surface, or may also be arranged at an angle with each other, so that the light emitting surfaces thereof form a polygonal light emitting surface that is approximately arc-shaped and uses the target object 3 as a circle center. In a second VCSEL module shown in FIG. 7, multiple VCSEL chips are separately arranged at equal intervals and equal angles by using the target object 3 as a circle center. Refer to FIG. 7 for a schematic structural diagram of the polygonal light emitting surface that is approximately arc-shaped of the VCSEL chip array 1. When the multiple VCSEL chips are arranged in a second manner into the polygonal light emitting surface that is approximately arc-shaped, light source energy thereof directly converges, so that energy density is high. To specifically embody the advantage of light beam direct convergence when the multiple VCSEL chips are arranged in the second manner into the polygonal light emitting surface that is approximately arc-shaped, the structure and package manner will be described in detail below with reference to FIG. 7 to FIG. 13. Therefore, first, the overall structure and advantage of the laser module are simply introduced herein.

The inner wall reflective optical transmission device 2 may be an inner wall total reflection-based light guide cone (which may be a parallel light cone, a step-shaped light cone, or the like) to implement laser transmission and convergence from a chip light emitting region to the target object 3 by means of inner wall total reflection. Higher refractive index and transmittance of the light guide cone and a shorter length of the light guide cone are preferred. However, the angle of the light guide cone needs to be selected with careful, for preventing the angle of the light guide cone from overflowing from a total reflection angle range due to a change of an incident angle after multiple total reflections. To improve transmittance efficiency of the light guide cone, optical antireflection films may be respectively evaporated on an incidence opening and an emission opening of the light guide cone.

The inner wall reflective optical transmission device 2 may optionally be a reflector barrel with a polished inner wall, and implement laser transmission and convergence from the chip light emitting region to the target object 3 by means of inner wall specular reflection. Also, a higher inner wall reflectivity, a smaller angle, and a shorter length of the reflector barrel are preferred.

Optimally, the inner wall reflective optical transmission device 2 performs parallel inner wall reflection, or forms an opening angle with the emission opening being greater than the incidence opening to facilitate sufficient emission of laser. Preferably, the opening angle is less than 15 degrees. If optical power density at an outlet position needs to be increased, small angle contraction from the incidence opening to the emission opening may further be performed. However, it should be noted that for the planar light emitting surface, a larger contraction angle indicates a greater affect on emission efficiency. However, if an inner wall reflective optical transmission device 2, whereof an area of an emission opening is less than that of a light emitting region of the VCSEL chips 10, is selected, optical power density on a surface of the target object 3 may be increased to some extent. It should be noted that any one of the foregoing designs may be selected for the planar light emitting surface, that is, the design of parallel inner wall reflection, the design that the emission opening is greater than the incidence opening, or the design that the emission opening is less than the incidence opening may be selected. However, for the polygonal light emitting surface that is approximately arc-shaped, preferably, the design that the emission opening is less than the incidence opening is selected, so as to further improve optical power density on the surface of the target object 3.

An end, close to the target object 3, of the inner wall reflective optical transmission device 2 is used as the emission opening, and an end, close to the VCSEL chip array 1, of the inner wall reflective optical transmission device 2 is used as the incidence opening. The incidence opening of the inner wall reflective optical transmission device 2 covers only an entire light emitting region of the VCSEL chip array 1, and gaps are reduced to a greatest extent, and coverage of non-light emitting regions of the VCSEL chips is avoided. For example, on a surface of the VCSEL chip array 1 shown in FIG. 5, the incidence opening of the inner wall reflective optical transmission device 2 may cover only light emitting surfaces of six VCSEL chips 10 in the middle (that is, the region in the dotted box in FIG. 5), and on a surface of the VCSEL chip array 1 shown in FIG. 6, the incidence opening of the inner wall reflective optical transmission device 2 may only cover light emitting surfaces of four VCSEL chips 10 that are densely arranged (that is, the region in the dotted box in FIG. 6), rather than the entire surface of the VCSEL chip array 1 shown in FIG. 5 and FIG. 6.

In this way, the light emitting region of the VCSEL chips and the inner wall reflective optical transmission device 2 form a cavity having an opening disposed on one end of the target object 3 and an inner wall with extremely high reflectivity. In the cavity, the vast majority of laser emitted by the VCSEL and laser reflected by the target object may be output from the emission opening on an end, close to the target object 3, of the inner wall reflective optical transmission device 2, and sufficiently absorbed by the target object 3 except a small quantity of optical loss caused by inner slight absorption, gap escape, and total reflection overflow (if a light guide cone is used).

In actual use, the incidence opening of the inner wall reflective optical transmission device 2 tightly covers the light emitting region of the VCSEL chips 10. The incidence opening of the inner wall reflective optical transmission device 2 should be close to the light emitting region of the VCSEL chips 10 to a greatest extent, to prevent laser escape on a gap. Meanwhile, the non-light emitting regions of the VCSEL chips 10 should be placed on an outer side of the optical device to a greatest extent, so as to sufficiently use the reflectivity, which is greater than 99.5%, of the light emitting surface of the VCSEL. The emission opening of the inner wall reflective optical transmission device should be close to the surface of the target object 3 to a greatest extent, but there is no specific mandatory requirement for distance. However, a smaller distance and a smaller gap indicate higher laser absorption efficiency of the target object.

In large power application scenarios, common edge-emitting lasers are usually superposed and packaged in sequence in a vertical direction, to implement relatively great total power output. Gaps need to be ensured among multiple edge-emitting lasers, to facilitate package and heat dissipation. The gaps usually include voids and thermal conductors. The gaps and chips together form the light emitting surface of the entire laser. The light emitting surface has low reflectivity for laser, and usually absorbs reflected light, rather than reflect the reflected light. Therefore, in a plurality of medical and industrial applications, the edge-emitting laser is usually adapted only to one-time radiation to the target object, and has a low utilization rate for reflected light reflected by the target object. However, on the other hand, the surface of the VCSEL chip array has extremely high reflectivity, in particular, in areas occupied by the VCSEL chips, the reflectivity reaches 99.5% or even above. Therefore, the VCSEL displays more excellent attributes in combination with a particular optical transmission device. In the VCSEL module, the surface of the VCSEL chip array may perform highly efficient secondary utilization on the reflected light rays reflected by the target object, so as to sufficiently improve a utilization rate of laser, and greatly improve laser emitting efficiency and target object absorptivity, thereby further improving optical power density of the emission opening.

Based on the above, depending on the extremely high reflectivity of surfaces of the VCSEL chips and the inner wall reflective optical transmission device, the VCSEL laser module provided in the present invention implements highly efficient laser transmission, and performs highly efficient secondary utilization on reflected light reflected by the target object, thereby sufficiently improving a laser utilization rate of laser. The structure may greatly improve laser emitting efficiency and target object absorptivity and may effectively converge light beams, so as to further improve optical power density of the emission opening. Because the VCSEL has a relatively long life of service, and displays high reliability in a pulse status, applying the foregoing VCSEL laser module to the field of high-power semiconductor lasers has extremely great practical significance. The high-power semiconductor laser including the foregoing VCSEL module has a simple structure and low costs, is convenient to be applied and implemented, and has broad application prospects in fields such as laser medical treatment and industrial laser processing.

A package structure when multiple VCSEL chips are arranged in a second manner into a polygonal light emitting surface that is approximately arc-shaped and a convergence method therefor are described in detail below with reference to FIG. 7 to FIG. 13.

Figure 3:
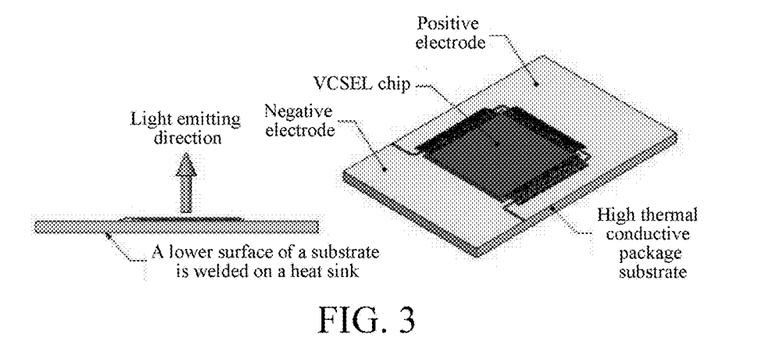
FIG. 3 is a schematic diagram of a package structure of a single VCSEL chip in the prior art.

In the prior art, a package structure of a VCSEL is shown in FIG. 3 and FIG. 4. A single VCSEL chip is usually directly welded on a heat dissipation substrate. A lower surface of the heat dissipation substrate is welded on a heat sink. The heat dissipation substrate has good thermal conductivity, and dissipates heat of the VCSEL in time by using the heat sink, so as to cool the VCSEL in use. In actual use, multiple VCSEL chips form the area array shown in FIG. 4. The multiple VCSEL chips are densely arranged on a horizontal heat sink to form a VCSEL array, so as to form a large light emitting surface. The multiple VCSEL chips are welded to each other by using metal wires. Refer to FIG. 5 and FIG. 6 for a package structure in which multiple VCSEL chips are densely arranged into a planar light emitting surface.

In high-power application scenarios such as medical treatment and industry, laser output by multiple laser chips usually needs to be converged, so as to achieve a high-power density at a target position. In the prior art, a relatively small light spot and extremely high-power density can be currently implemented by controlling a chip interval, optical alignment, and lens focusing of an edge-emitting laser. However, because a VCSEL is a surface light emitting structure, intervals among chips cannot further be compressed, and it is also difficult to perform optical alignment. Therefore, the optical convergence method applied to the edge-emitting semiconductor laser array is not applicable to optical convergence of the VCSEL array. Therefore, how to perform focusing on multiple VCSEL chips at a particular position is an urgent problem to be resolved.

Figure 8:
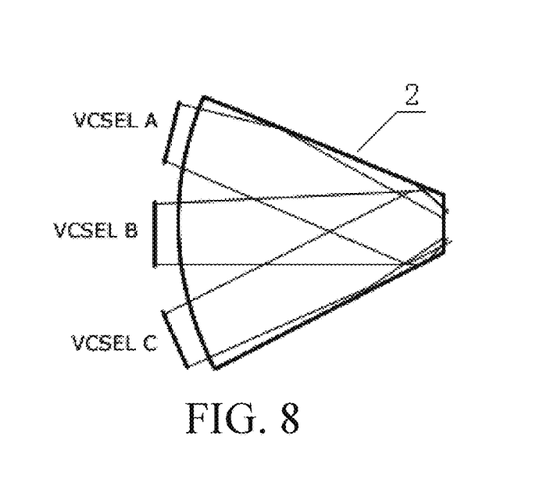
FIG. 8 is a schematic diagram of a convergence principle of the second VCSEL module according to the embodiment of the present invention.

An embodiment of the present invention provides an optical convergence method for a VCSEL. An arrangement shape of a VCSEL array is changed, to implement light beam convergence of multiple VCSEL chips at a particular position. As shown in FIG. 8, in the optical convergence method, light beam convergence of VCSEL chip light emitting units is implemented by enabling all VCSEL chips 10 in an VCSEL array or orthographic projections thereof to be distributed on a partial outer circumference of a same circle, and enabling central normals of all the VCSEL chips 10 to intersect at a position of a circle center to form a focus. In the VCSEL array, the VCSEL chips are usually densely arranged in a region. Therefore, a distribution manner of the VCSEL chips is defined as fan-shaped distribution, and a distance between the VCSEL chips 10 and the focus is defined as a focal length.

The VCSEL chips are circular light sources, and have relatively small divergence angles (a full angle of the divergence angle is approximately 15 degrees to 20 degrees), far field intensity of the VCSEL chips is in approximately flat top distribution, and energy is uniform. Therefore, different VCSEL chips 10 are enabled to emit laser to a same position by changing an arrangement manner of the VCSEL chips, so as to implement power superposition of all the VCSEL chips 10 at the position of circle center. As compared with the edge-emitting semiconductor laser, because divergence angles of laser beams emitted by the VCSEL are relatively small, light rays emitted by the VCSEL array are more easily converged and energy distribution of the VCSEL array on a far field target object is more uniform.

Figure 9:
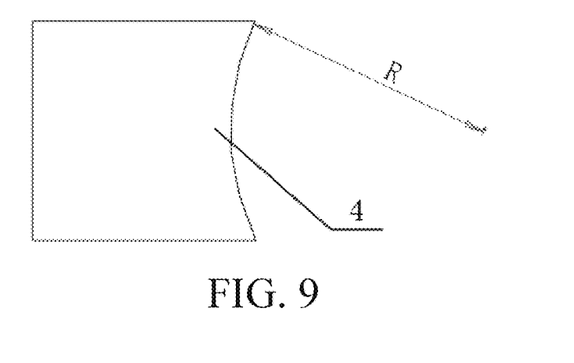
FIG. 9 is a schematic front view of an arc-shaped heat sink according to an embodiment of the present invention.
Figure 10:
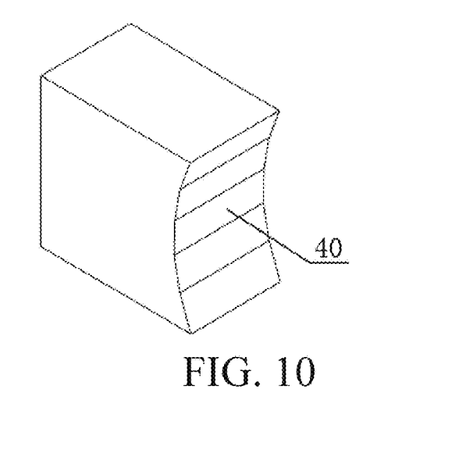
FIG. 10 is a three-dimensional schematic structural diagram of the arc-shaped heat sink in FIG. 9.

To implement fan-shaped distribution of the VCSEL chips, after experiments and researches, a heat sink 4, whereof a cross section of a package surface is in a shape of an arc-shaped circumscribed polygon shown in FIG. 9 is manufactured (because the package surface of the heat sink is approximately arc-shaped, the heat sink is briefly referred to as an arc-shaped heat sink). The VCSEL array 1 is packaged by using the heat sink 4 having the package surface that is recessed inwards. The package surface of the heat sink is shown in FIG. 10, and is formed by multiple small package planes 40 that are distributed on different heights and arranged at an angle with each other. The multiple small package planes 40 form a circumscribed polygon of a circle that uses the focus as a circle center O, and central normals of the small package planes 40 intersect at the position of the circle center O. A specific structure of the heat sink and a manner of packaging the VCSEL array by the heat sink will be introduced in detail in the following embodiment.

In addition, to further compress light beams of the VCSEL chips and limit laser propagation at the same time, an optical transmission device 2 is further disposed in front of the VCSEL chips. Preferably, an inner wall of the optical transmission device 2 may totally reflect light beams illuminated on the inner wall of the optical transmission device 2. Laser rays emitted by the VCSEL array may further be compressed by using an optical transmission device 2, whereof a cross section of a light incident surface is in a shape of an arc or an arc surface circumscribed polygon. The optical transmission device 2 is disposed in front of a light emitting surface of the VCSEL array. The inner wall of the optical transmission device 2 is parallel to a radius direction R of a circle that uses the focus as a circle center and uses the focal length as a radius. Moreover, a length of the optical transmission device 2 is less than the focus length. In actual use, the optical transmission device 2 may be a reflector barrel with a polished inner wall or an inner wall total reflection-based light guide cone.

A package structure of a VCSEL for implementing the foregoing optical focusing method provided in the present invention is described below with reference to a specific embodiment.

To converge light beams of the multiple VCSEL chips, an embodiment of the present invention provides a polygonal heat sink, whereof a cross section of a package surface is circumscribed on an arc surface, for packaging the VCSEL array, so as to implement optical convergence of the multiple VCSEL chips in one direction near a position of a circle center of the arc surface.

Figure 11:
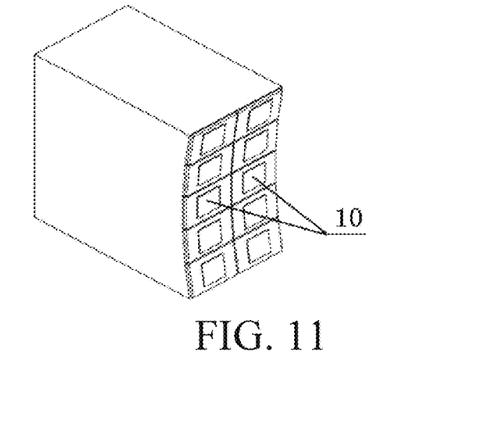
FIG. 11 is a schematic diagram of a package structure that is based on the arc-shaped heat sink in FIG. 10 and of a VCSEL array.

As shown in FIG. 9, FIG. 10, and FIG. 11, the cross section of the package surface of the arc-shaped heat sink 4 is approximately in a shape of an arc that is recessed inwards. Specifically, the package surface is a polygon formed by cross sections, arranged at an angle with each other, of the multiple small package planes 40. The polygon is a partial circumscribed polygon of a circle that uses the focus of the VCSEL array (a convergent point where the target object is located) as the circle center O and uses the focal length as the radius R. Central normals of the small package planes 40 intersect at the focus (that is, the circle center O). In actual use, the convergent point may deviate to some extent, as long as the central normals of the small package planes 40 intersect near the focus. However, a deviation range should be limited within an extremely small angle.

The package structure of a VCSEL provided in this embodiment of the present invention packages all the VCSEL chips 10 in the VCSEL array 1 by using the foregoing arc-shaped heat sink 4. As shown in FIG. 11, all the VCSEL chips 10 in the VCSEL array 1 are respectively installed on the small package planes 40 of the arc-shaped heat sink 4, and one or more VCSEL chips 10 may be packaged on each of the small package planes 40, so that orthographic projections of all the VCSEL chips 10 are distributed on an outer circumference of a circle that uses the focus as the circle center O and uses the focal length as the radius R, central normals of all the VCSEL chips interact at the position of the circle center, and a distance between the VCSEL chips and the focus forms a focal length.

Figure 12:
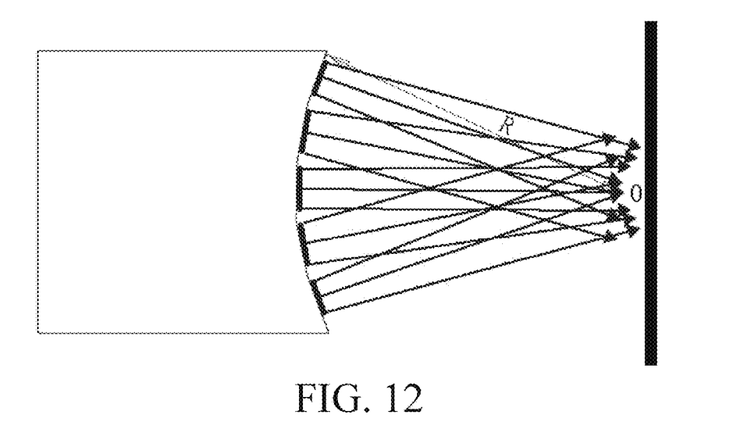
FIG. 12 is a schematic diagram of a convergence principle of the package structure of a VCSEL chip array in FIG. 11.

The package structure of a VCSEL is introduced above. As shown in FIG. 12, convergence of VCSEL chips near the focus (that is, the circle center O) may be implemented by respectively packaging the VCSEL chips 10 on the small package planes 40 of the arc-shaped heat sink 4. Therefore, light beams of all VCSEL light emitting units may intersect at the position of the circle center along central normal directions of the VCSEL chips 10, to implement power superposition.

To perform further light beam compression on the foregoing converged light beams, an optical transmission device 2, a light incident surface of which is an arc surface or an arc surface circumscribed polygon, is also used when the arc-shaped heat sink is used in the package structure in the high-power semiconductor laser provided in this embodiment of the present invention. Highly efficient transmission of laser may be implemented by using the optical transmission device 2, which also has a light beam compression function on laser, to implement a light beam convergence function.

Figure 13:
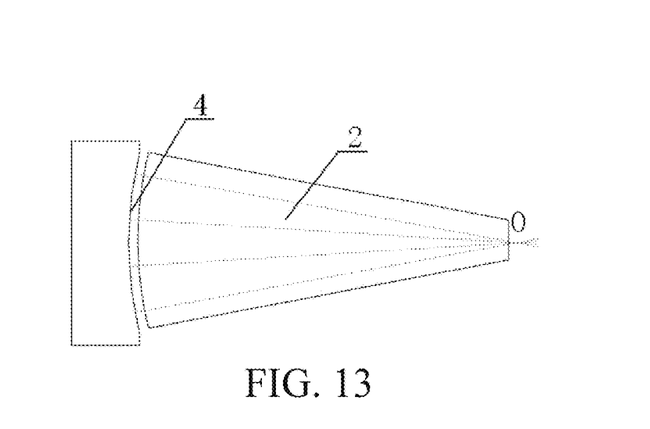
FIG. 13 is a schematic diagram of a package structure that is based on an arc-shaped heat sink and a light guide cone and of a VCSEL.

As shown in FIG. 13, a cross section of the light incident surface of the optical transmission device 2 is in a shape of an arc, a circle center of the light incident surface is the same as the convergent point of the laser, so that the light incident surface is tangent to a light emitting surface of each VCSEL chip in the VCSEL array. A central normal of the light emitting surface of the VCSEL chip is perpendicular to the light incident surface of the optical transmission device 2. Laser emitted by the VCSEL chip 10 may be perpendicularly incident into the optical transmission device 2, and each divergence angle of the VCSEL may be compressed. The inner wall of the optical transmission device 2 may be arranged parallel to the radius direction of the circle that uses the focus as the circle center and uses the focal length as the radius. That is, four side walls of the optical transmission device 2 may be arranged parallel to a radius direction between an outermost side of the VCSEL array and the target object, and convergence output on an end, close to the circle center, of the optical transmission device 2 is implemented by means of inner wall total reflection of upper and lower surfaces and left and right side surfaces of the optical transmission device 2. The light incident surface of the optical transmission device 2 is greater than the light emitting surface thereof. The light emitting surface thereof is disposed near the target object. A length of the optical transmission device 2 is less than a length of the focus length of the VCSEL array.

In actual use, a reflector barrel with a polished inner wall or an inner wall total reflection-based light guide cone is usually selected as the optical transmission device 2. The reflector barrel implements laser transmission and convergence from the chip light emitting region to the target object 3 by means of inner wall specular reflection. The light guide cone implements laser transmission and convergence from the chip light emitting region to the target object 3 by means of inner wall total reflection. To improve transmittance efficiency of the light guide cone, optical antireflection films may be respectively evaporated on a light incident surface and a light emitting surface of the light guide cone. The tapered reflector barrel or light guide cone converges light beams to an output window on a relatively small side, to implement the optical convergence function.

To improve output power density of the VCSEL array, in the VCSEL array, all the VCSEL chips should be densely arranged to reduce gaps among the VCSEL chips to a greatest extent, which on the one hand, reduces a volume of the package structure, and on the other hand, implements highly efficient secondary utilization by the VCSEL chips on reflected light rays reflected by the target object and the optical transmission device 2 by sufficiently using intrinsic high reflectivity of the VCSEL chips. A surface of the VCSEL chip array has extremely high reflectivity, in particular, in areas occupied by the VCSEL chips, the reflectivity reaches 99.5% or even above. Therefore, performing, by the surface of the VCSEL chip array, highly efficient secondary utilization on the reflected lights reflected by the target object has non-negligible enhancing effects on output power illuminated on the target object, and sufficiently improves a utilization rate of laser. However, when the optical transmission device 2 shown in FIG. 13 is used to perform coupling on the light emitting surface of the VCSEL array, by enabling the light incident surface of the optical transmission device to cover only an entire light emitting region of the VCSEL chip array, affects of the non-light emitting regions in the VCSEL array on the reflected light rays may be reduced, and laser escape may be reduced.

In addition, the cross section of the optical transmission device 2 may also be in a shape of an arc surface circumscribed polygon (not shown). The light incident surface of the optical transmission device 2 may be formed by multiple small planes at an angle with each other, and a circle center thereof is homocentric to the circle center of the heat sink. A central normal of a VCSEL chip packaged on each small package plane may be enabled to be perpendicular to a small plane corresponding thereto by enabling each small plane of the optical transmission device 2 to correspond and be parallel to a single small package plane 40 of the arc-shaped heat sink 4, so that laser emitted by the VCSEL chip 10 may be perpendicularly incident into the optical transmission device 2, and each divergence angle of the VCSEL may be compressed. In addition, the configuration of the arc surface circumscribed polygon greatly reduces a distance between the VCSEL chip 10 and the optical transmission device 2, so as to reduce laser escape on a gap.

The package structure of the VCSEL is provided above. The multiple VCSEL chips may implement convergence output on an end close to the circle center by means of inner wall total reflection or specular reflection of upper and lower surfaces and left and right side surfaces of the light guide cone or the reflector barrel. Optimally, a position of an outlet is at the circle center or near the circle center. In addition, the left and right side surfaces thereof may gradually approach to the circle center to form an acute angle, so as to further compress light beams.

In addition, when a single group of VCSEL chips is used to form a linear VCSEL array, the linear VCSEL array is packaged on a planar heat sink to directly output laser in cooperation with a step-shaped light guide cone or a reflector barrel. When two groups of VCSEL chips are used to form an elongated VCSEL array, the two groups of VCSEL chips may be packaged on a V-shape heat sink to implement light beam convergence at an outlet position in cooperation with a light guide cone or a tapered reflector barrel. In this case, it should be noted that the optical transmission device 2 is used to perform compression on the VCSEL in a lengthwise direction to make the VCSEL converge at one point.

Certainly, the heat sink that packages a single group of VCSEL chips may also be directly made into a shape of which a cross section is a circumscribed polygon of a circle. In this case, the case in which the single group of VCSEL chips are packaged by the heat sink is the same as the case in which only one VCSEL chip is packaged on each small package plane, and therefore details are not described herein again.

Based on the above, the present invention provides an optical convergence method for a VCSEL, and a package structure thereof. A VCSEL is packaged by using a heat sink based on an arc surface polygon, so as to achieve the objective of light beam convergence near a position of a circle center. A package surface of a laser heat sink is a circumscribed polygon of a circle. Central normal directions of package planes intersect near the position of a circle center. One or more VCSEL chips may be packaged on each of the package planes. For small power application, the heat sink may perform cooling by means of transmission refrigeration or a common water channel. For high-power application, the heat sink may be processed into a water through cooling structure with a micro channel, to improve heat exchange efficiency. In different package structures, for light beam convergence of multiple VCSEL chips, convergence of multiple VCSEL light beams may be implemented without depending on an outer lens, or further light spot compression may also be implemented in cooperation with an outer optical device (such as a light guide cone or a tapered lens barrel). The package manner is simple and easy to be implemented.

The foregoing package structure of a VCSEL forms an actually available laser module. As compared with an edge-emitting laser module of a common parallel light cone or lens barrel, the laser module has the following obvious advantages: the laser module replaces a conventional edge-emitting laser with a VCSEL, so as to greatly improve reliability of the laser; the laser module may work under a temperature of 80° C. or even above, and is more applicable to a severe environmental temperature; the laser module has higher convergence efficiency (because divergence angles of the VCSEL are smaller and converge to a circle center), and optical loss is small; distribution of the laser module at an optical outlet position is more uniform, and is approximately flat top distribution, rather than superposed Gaussian distribution; and the laser module implements higher power density more easily than the edge-emitting laser module. Therefore, the optical convergence method overcomes the disadvantages of low reliability and lack of high temperature resistance of the conventional edge-emitting semiconductor laser over past several decades, and greatly improves life of service of the laser in a pulse status. Meanwhile, by introducing an optical transmission device having a convergence function, power superposition of multiple VCSEL light emitting units is implemented when high transmission efficiency is ensured, so as to greatly improve power density at an optical outlet, and ensure relatively uniform optical energy distribution. The package structure of a VCSEL has broad application prospects in laser medical and industrial laser processing fields.

The foregoing describes the High-power semiconductor laser based on VCSEL and the optical convergence method therefor provided in the present invention in detail. For a person of ordinary skill in the art, any obvious modification made to the present invention without departing from the essential spirit of the present invention constitutes infringement on the patent right of the present invention, and corresponding legal liabilities shall be born.

What is claimed is:

1. A High-power semiconductor laser based on VCSEL, comprising a VCSEL module, wherein the VCSEL module comprises a VCSEL chip array formed by multiple VCSEL chips and an inner wall reflective optical transmission device disposed in front of a light emitting surface of the VCSEL chip array, and the light emitting surface of the VCSEL chip array performs secondary reflection on reflected light rays reflected by a target object and the inner wall reflective optical transmission device.

2. The high-power semiconductor laser according to claim 1, wherein:
    an area of an emission opening of the inner wall reflective optical transmission device is less than that of an incidence opening thereof.

3. The high-power semiconductor laser according to claim 1, wherein:
    the incidence opening of the inner wall reflective optical transmission device covers only an entire light emitting region of the VCSEL chip array.

4. The high-power semiconductor laser according to claim 1, wherein:
    in the VCSEL chip array, the multiple VCSEL chips are densely arranged in one plane, and light emitting surfaces thereof form a planar light emitting surface.

5. The high-power semiconductor laser according to claim 1, wherein:
    in the VCSEL chip array, the multiple VCSEL chips are arranged at an angle with each other, and light emitting surfaces of the multiple VCSEL chips form a circumscribed polygonal light emitting surface that is approximately arc-shaped and uses the target object as a circle center.

6. The high-power semiconductor laser according to claim 1, wherein:
    the inner wall reflective optical transmission device is a reflector barrel with a polished inner wall.

7. The high-power semiconductor laser according to claim 1, wherein:
    the inner wall reflective optical transmission device is an inner wall total reflection-based light guide cone.

8. The high-power semiconductor laser according to claim 7, wherein:
    optical antireflection films are respectively evaporated on the incidence opening and the emission opening of the light guide cone.

9. A High-power semiconductor laser based on VCSEL, comprising a VCSEL package structure, wherein the VCSEL package structure comprises a VCSEL array formed by multiple VCSEL chips and an arc-shaped heat sink for packaging the VCSEL array, a cross section of a package surface of the arc-shaped heat sink is a partial circumscribed polygon of a circle, the package surface is formed by multiple small package planes at an angle with each other;

the package surface is recessed inwards, and central normals of the small package planes intersect at a position of a circle center; and
all VCSEL chips in the VCSEL array are respectively installed on the small package planes of the heat sink, so that all the VCSEL chips are distributed on an outer circumference of a same circle, and central normals of all the VCSEL chips intersect at a position of a circle center to form a focus, and a distance between the VCSEL chips and the focus forms a focal length.

10. The high-power semiconductor laser according to claim 9, wherein:
each of the small package planes is used to package one or more VCSEL chips.

11. The high-power semiconductor laser according to claim 9, wherein:
an optical transmission device, whereof a cross section of a light incident surface is in a shape of an arc or an arc surface circumscribed polygon, is disposed in front of the VCSEL, array, an inner wall of the optical transmission device is parallel to a radius direction of a circle that uses the focus as a circle center and uses the focal length as a radius, and a length of the optical transmission device is less than the focus length of the VCSEL array.

12. The high-power semiconductor laser according to claim 11, wherein:
the optical transmission device is a reflector barrel with a polished inner wall or an inner wall total reflection-based light guide cone.

13. The high-power semiconductor laser according to claim 12, wherein:
optical antireflection films are respectively evaporated on the light incident surface and a light emitting surface of the light guide cone.

14. The high-power semiconductor laser according to claim 11, wherein:
in the VCSEL array, the VCSEL chips are densely arranged; and
a light incident surface of the optical transmission device covers only an entire light emitting region of the VCSEL chip array.

15. An optical convergence method for a VCSEL, comprising the following steps:
enabling all VCSEL chips in an VCSEL array or orthographic projections thereof to be distributed on an outer circumference of a same circle, and enabling central normals of all the VCSEL chips to intersect at a position of a circle center to form a focus; and a distance between the VCSEL chips and the focus forms a focal length;
laser rays emitted by the VCSEL array are converged by using an optical transmission device, whereof a cross section of a light incident surface is in a shape of an arc or an arc surface circumscribed polygon, and the optical transmission device is disposed in front of a light emitting surface of the VCSEL array, an inner wall of the optical transmission device is parallel to a radius direction of a circle that uses the focus as a circle center and uses the focal length as a radius, and a length of the optical transmission device is less than a length of the focus length.

16. The optical convergence method according to claim 15, wherein:
the VCSEL array is packaged by using a heat sink having a package surface that is recessed inwards, the package surface of the heat sink is formed by multiple small package planes at an angle with each other, a cross section of the package surface is a partial circumscribed polygon of a circle that uses the focus as a circle center, and central normals of the small package planes intersect at a position of a circle center.

17. The optical convergence method according to claim 15, wherein:
the optical transmission device is a reflector barrel with a polished inner wall or an inner wall total reflection-based light guide cone.

* * * * *